(12) United States Patent
Branham

(10) Patent No.: US 6,172,443 B1
(45) Date of Patent: Jan. 9, 2001

(54) QUARTZ CRYSTAL RESONATOR WITH IMPROVED TEMPERATURE PERFORMANCE AND METHOD THEREFOR

(75) Inventor: Mark S. Branham, Cheektowago, NY (US)

(73) Assignee: CTS Corporation, Elkhart, IN (US)

( * ) Notice: Under 35 U.S.C. 154(b), the term of this patent shall be extended for 0 days.

(21) Appl. No.: 09/198,986

(22) Filed: Nov. 24, 1998

(Under 37 CFR 1.47)

(51) Int. Cl.⁷ .................................................. H01L 41/04
(52) U.S. Cl. ...................................... 310/313 A; 310/361
(58) Field of Search ..................................... 310/361, 360

(56) References Cited

U.S. PATENT DOCUMENTS

| | | | |
|---|---|---|---|
| 4,178,566 | * 12/1979 | Kawashima | 331/156 |
| 4,313,071 | * 1/1982 | Hermann et al. | 310/361 |
| 4,398,115 | * 8/1983 | Gagnepain et al. | 310/313 A |
| 4,499,395 | * 2/1985 | Kahan | 310/361 |
| 4,772,130 | * 9/1988 | Ueda et al. | 374/117 |
| 5,274,297 | * 12/1993 | Hermann et al. | 310/361 |
| 5,577,308 | 11/1996 | Arvanitis et al. | 29/25.35 |
| 5,650,075 | 7/1997 | Haas et al. | 216/97 |

* cited by examiner

Primary Examiner—Nestor Ramirez
Assistant Examiner—Peter Medley
(74) Attorney, Agent, or Firm—Brian Mancini

(57) ABSTRACT

Quartz crystal resonators 30 with a first angle of rotation having an X-axis 17 and Z'-axis 19 lying within a plane corresponding to an AT-cut and a second angle of rotation 34 within the plane of the AT-cut and lying within a range of about ±1° to about ±11.5° from the Z'-axis of the AT-cut. The resonators includes substantially opposing electrodes 36 disposed on major faces of the quartz crystal plate 32. The second angle of rotation 34 results in quartz crystal resonators 30 being produced with a more uniform distribution of temperature performances.

11 Claims, 3 Drawing Sheets

QUARTZ CRYSTAL RESONATOR WITH IMPROVED TEMPERATURE PERFORMANCE AND METHOD THEREFOR

FIELD OF THE INVENTION

The present invention relates generally to piezoelectric devices and, in particular, to quartz crystal resonators having a particular crystallographic angle cut.

BACKGROUND OF THE INVENTION

Piezoelectric resonators are known to include various types and shapes of devices produced from various piezoelectric materials. Typical piezoelectric elements consist of substantially rectangular or round plates made from quartz. These piezoelectric resonators are commonly used for frequency control in electronic devices such as, computers, cellular phones, pagers, radios and wireless data devices, etc. Generally, these types of communication devices demand low frequency deviation over temperature. Also, as consumer demand continually drives down the size and cost of this equipment, the need for piezoelectric devices to be smaller and lower cost while maintaining tight temperature performance has become even greater.

Typically, a miniature piezoelectric resonator is rectangular, as this shape is the most easily packaged in a small size. In addition, quartz is the substrate material of choice due to its low cost. In particular, the AT-cut of quartz provides one of the lowest cost substrates while also providing good frequency-temperature performance. An AT-cut plate is defined as a plate cut at a crystallographic angle of about 35.3° rotated about a X axis from a +Z axis to a −Y axis. Although the AT-cut provides good frequency performance over temperature, the modern trend is for tighter and tighter frequency-temperature performance from piezoelectric resonators which has resulted in the use of external temperature compensation schemes being applied to AT-cut quartz resonators.

In manufacturing AT-cut quartz blanks it is customary to test the frequency performance of the resonator over a temperature range of about −30° C. to +85° C. Generally, an ideal AT-cut quartz blank will present a curve 10 with a frequency deviation over this temperature range of less than about 15 ppm, as shown in FIG. 1. Temperature testing of AT-cut resonators produces a third-order frequency-temperature response that is better known in the industry as a Bechmann curve. The Bechmann curve for each resonator is closely dependent on the exact angle cut of the quartz blank, which varies during the quartz blank wafering process. However, the Bechmann curve is also subject to other external influences such as mechanical stress on the quartz blank when it is mounted or when it is plated with electrodes, for example, and to internal influences such as coupling to other modes. Therefore, it is useful to take the measured Bechmann curve of a quartz and reference it back to an associated equivalent theoretical angle cut which would produce that same curve if there were no other influences.

In practice, any deviation from a desired theoretical AT-cut angle during blank processing produces a linear rotation of the Bechmann curve about an inflection temperature 12, inasmuch as the first derivatives with respect to angle of the third-order temperature coefficients of the Bechmann curve are linear for the AT-cut. As a result, the tested frequency-temperature performance curves of a group a AT-cut quartz resonators will produce a mean theoretical AT-cut angle curve 10 having some type of statistical normal distribution about that mean, expressed in terms of angle. For example, a theoretical AT-cut angle of 35° 20' will produce a curve 10 having a total frequency excursion of 14 ppm (+5 to −9 ppm). However, its is typically experienced that a group a quartz resonators present a one-sigma normal distribution 14 of about ±1' about the mean angle. In this case, a quartz resonator having a theoretical AT-cut angle at 35° 21' will produce a curve 16 having a total frequency excursion of about 19 ppm (+7 to −12 ppm). For a specification of 20 ppm, this means that about one-sixth of the population will fall outside of the allowable 20 ppm range. This is an unacceptable yield that would require subsequent temperature compensation to correct.

The breadth of the normal distribution can be lessened somewhat by angle control methodologies which rely on physical limitations to the angle at which quartz blanks are cut. For example, better quality saws and lapping machines can be utilized so that less angle variations are produced.

However, even these improvements do not provide resonators with tight enough frequency-temperature performance to satisfy today's radio communication device requirement. In addition, improved wafering processes do not account for other influences such as stress due to depositing electrodes or mounting the resonators, and coupling to other vibrational modes having different temperature characteristics, such as a flexure mode for example. Therefore, it is still industry practice to temperature test each resonator to verify performance. However, temperature testing is time consuming, capital intensive, and represents a major constituent of processing costs.

There is a need for an improved apparatus and method to provide quartz resonators that: (i) are low cost; (ii) improves yields; (iii) tightens the distribution of measured frequency temperature performance; (iv) requires no extra processing; and (v) reduces the need for temperature testing.

DETAILED DESCRIPTION OF THE PREFERRED EMBODIMENT

The present invention provides an improved apparatus and method for producing rectangular quartz resonators which results in a tightened distribution of measured frequency temperature performance of the resonators. The tightened distribution results in improved yields and lower costs. The present invention requires no extra processing steps and reduces the need for temperature testing of quartz resonators which further reduces costs. Moreover, in many cases, temperature testing can be completely eliminated.

Figure 1:
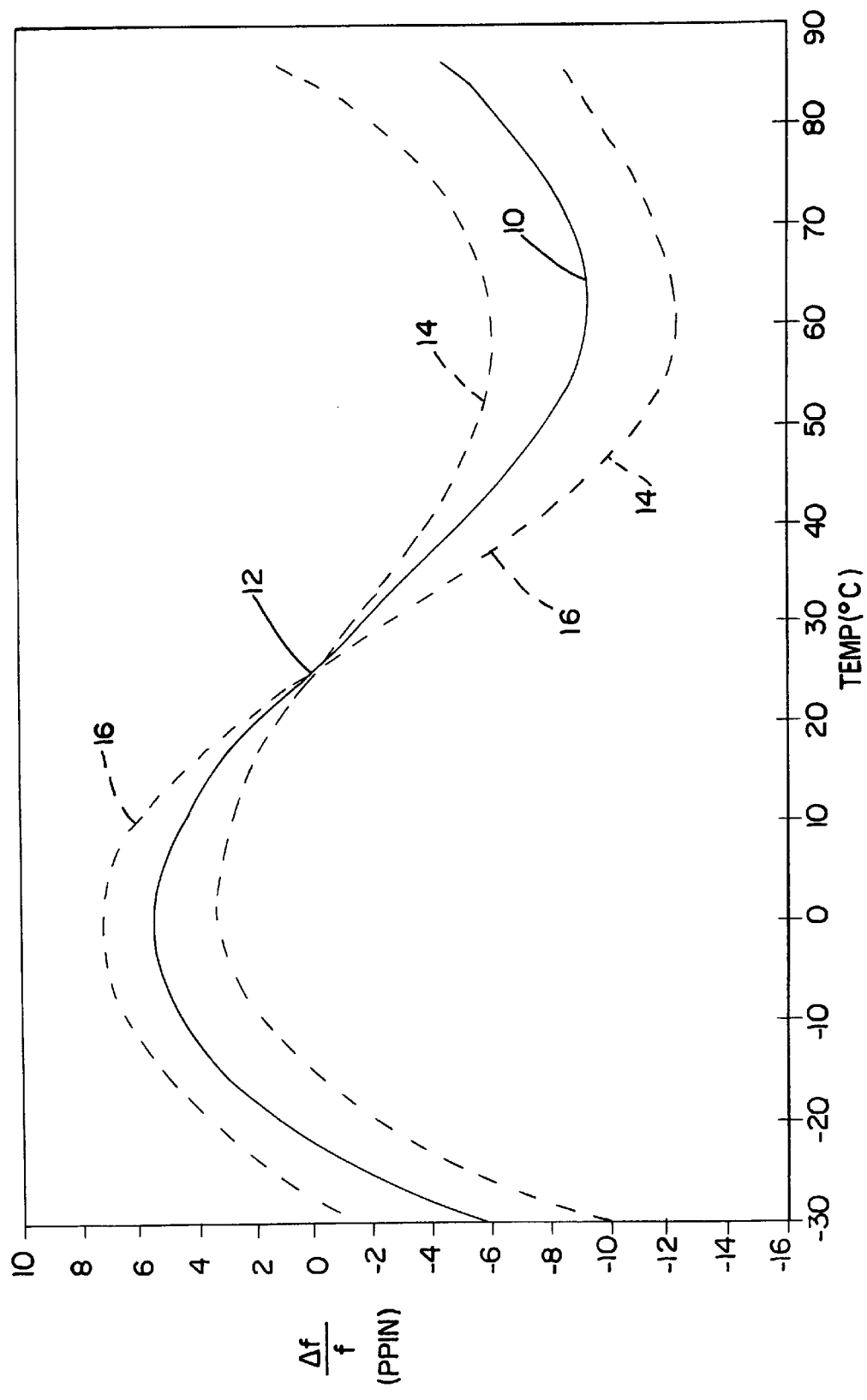
FIG. 1 shows a graphical representation of a frequency versus temperature response of an AT-cut quartz resonator.
Figure 2:
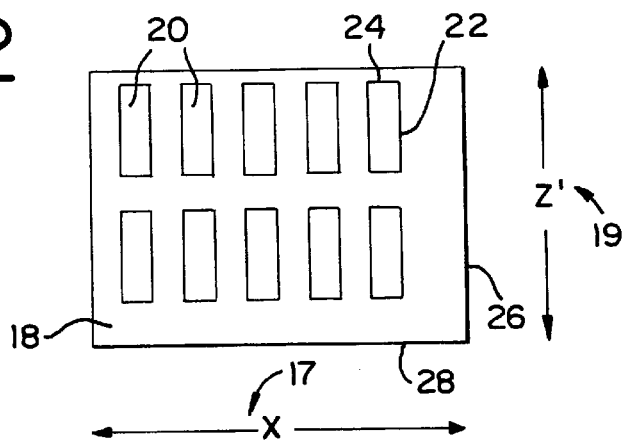
FIG. 2 shows a plan view of a prior art quartz wafer with blanks oriented on the wafer.

FIG. 2 shows a prior art quartz wafer 18 used to produce rectangular AT-cut quartz blanks 20 photolithographically. Photolithographic processing of piezoelectric wafers is known in the art. In simplified terms photolithographic processing includes coating a piezoelectric wafer with metal and photoresist, respectively. This is followed by exposing the photoresist to light through a mask and developing the photoresist, etching the metal, and etching through the piezoelectric wafer to define each resonator.

Additional processing may include photoresist stripping, wafer cleaning and testing procedures. A more detailed explanation of photolithographic processing is presented in U.S. Pat. No. 5,650,075 to Haas et al., which is hereby incorporated by reference.

As shown in FIG. 2, the prior art quartz wafer 18 is an AT-cut itself and is cut from a crystal bar at a crystallographic angle of about 35.3° rotated about a X axis 17 from a +Z axis to a −Y axis defining a Z' axis 19, as is known in the art. As a result, the quartz wafer 18 has a length 26 in a Z' direction and a width 28 in a X direction. Rectangular blanks 20 are produced from the wafer 18, each having a length (major dimension) 22 in the Z' direction and a width (minor dimension) 24 in the X direction. However, rectangular blanks can also be produced having a length (major dimension) in the X direction and a width (minor dimension) in the Z' direction.

Figure 3:
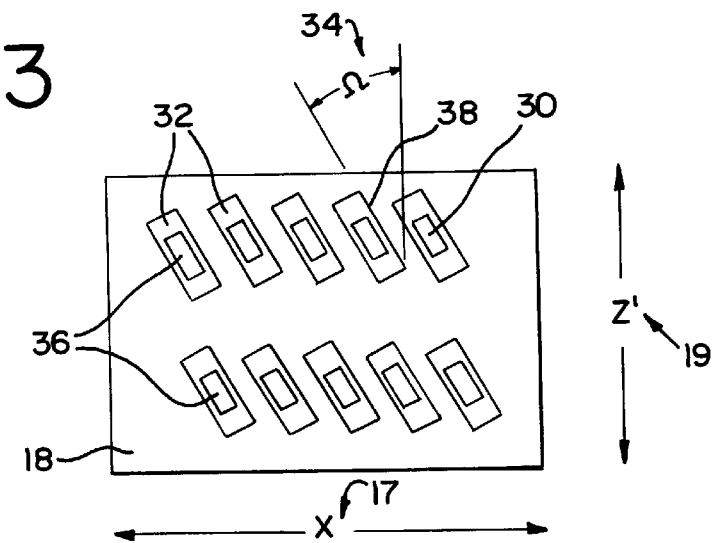
FIG. 3 shows a plan view of a quartz wafer with blanks oriented on the wafer, in accordance with a preferred embodiment of the present invention.

FIG. 3 show a preferred embodiment of quartz crystal resonators 30 with improved temperature performance, in accordance with the present invention. The resonators 30 are manufactured from an AT-cut quartz wafer 18 as defined and explained above. Each resonator 30 includes a quartz crystal plate 32 with a first angle of rotation having an X-axis 17 and Z'-axis 19 lying within a plane corresponding to an AT-cut, as is known in the art, and a second angle of rotation ($\Omega$) 34, within the plane of the AT-cut wafer 18 and lying within a range of about ±10 to about ±11.5° from the Z'-axis 19 of the AT-cut (i.e. about +1° to +11.5° or about −1° to −11.50).

Each resonator 30 also includes electrodes 36 disposed on opposing major faces of each quartz crystal plate 32 so as to be substantially opposing, as is known in the art.

Figure 4:
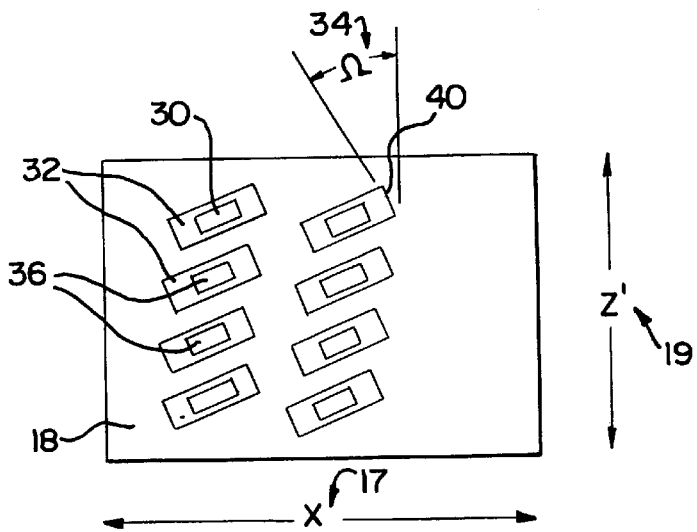
FIG. 4 shows a plan view of a quartz wafer with blanks oriented on the wafer, in accordance with an alternate embodiment of the present invention.

Preferably, the quartz crystal resonator 30 of the present invention includes the quartz crystal plate 32 being rectangular with a major dimension (length) 38 along the second angle of rotation 34. However, in an alternative embodiment, as shown in FIG. 4 each rectangular quartz crystal plate 32 has a minor dimension (width) along the second angle of rotation. The other aspects of the wafer 18 and resonators 30 being identical to the description of FIG. 3, which is hereby incorporated by reference.

More preferably, the second angle of rotation ($\Omega$) is about ±10° from the Z'-axis 18 of the AT-cut. FIGS. 3 and 4 show the second angle of rotation ($\Omega$) 34 being about +10° from the Z'-axis 18 of the AT-cut, but −10° works equally well. Resonators 30 produced at ±10° show the tightest distribution of equivalent Bechmann angles as demonstrated in the experimental example below. However, it should also be noted that the optimal second angle of rotation ($\Omega$) 34, is a function of the actual angle of the Z'-axis 18 of the AT-cut inasmuch as there is a small range of Z'-axis angles accepted in the art that can comprise an AT-cut. It was found that a minor change in the exact AT-cut angle produces a corresponding minor change (<1°) in the optimum $\Omega$ rotation.

EXAMPLE

Wafers and resonators were produced in accordance with both FIGS. 2 and 3. The disposed electrodes and frequencies of the resonators were identical. In addition, the same photolithographic masks were used (only rotated +10° in the case of the resonators produced in accordance with the preferred embodiment of the present invention as shown in FIG. 3). Over 2500 resonators were produced in accordance with the present invention, and all were temperature tested and compared with production numbers of conventionally produced quartz resonators (as represented in FIG. 2). Prior art photolithographically-produced quartz resonators (with 0° second ($\Omega$) rotation as shown in FIG. 2) provide a normal distribution of theoretical Bechmann angles having a one-sigma distribution of 1.05 minutes. The quartz resonators of the present invention (as shown in FIG. 3) provided a normal distribution of theoretical Bechmann angles having a one-sigma distribution of 0.49 minutes. Therefore, the present invention provides quartz resonators with a much tighter frequency versus temperature performance than prior art quartz resonators.

Figure 5:
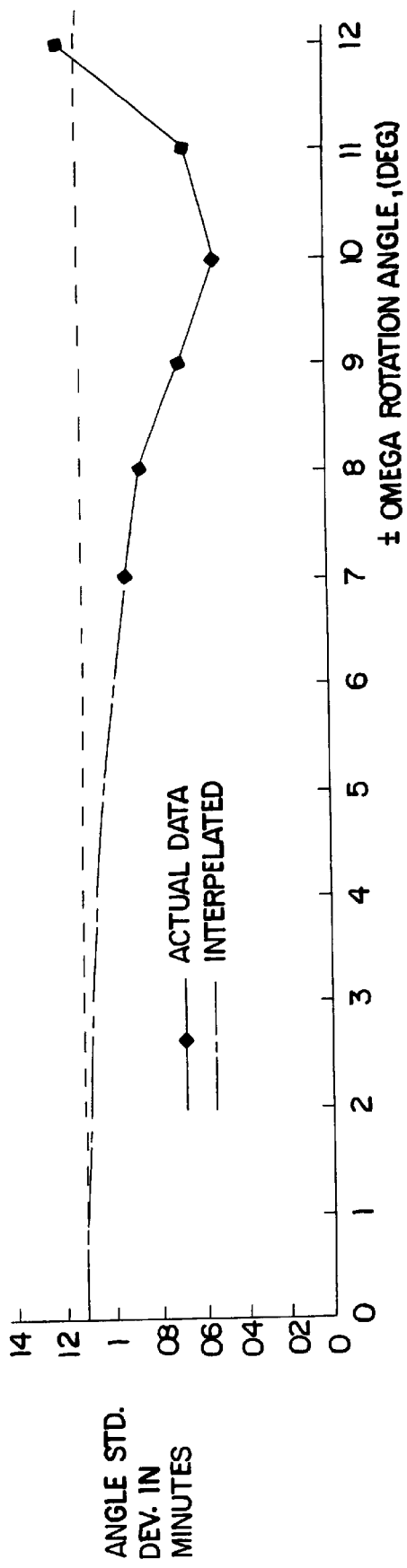
FIG. 5 shows a graphical representation of the one-sigma distribution of quartz resonators at various second rotations, in accordance with the present invention.
Figure 6:
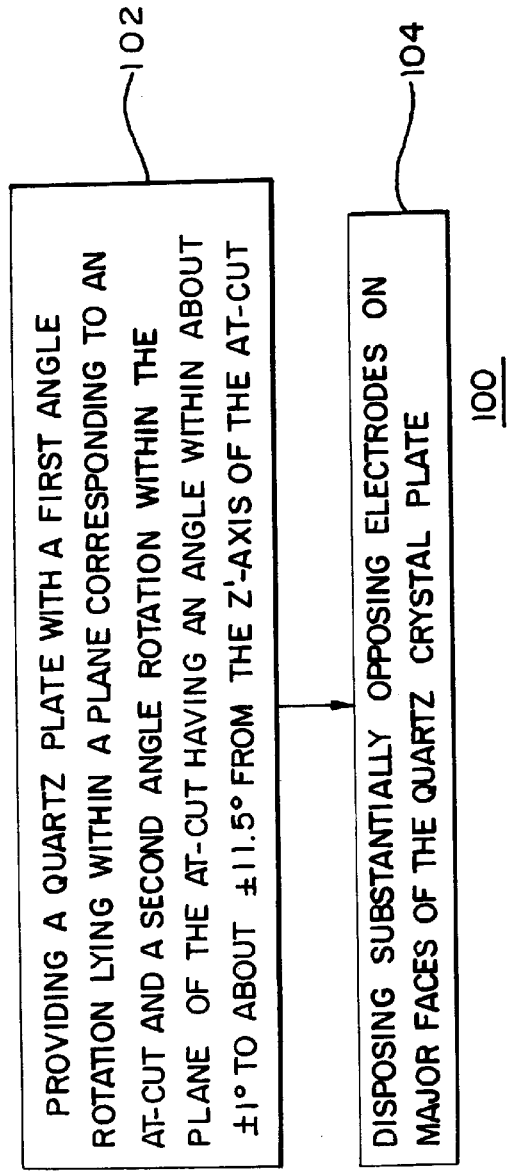
FIG. 6 a block diagram for a method of providing quartz crystal resonators with improved temperature performance, in accordance with the present invention.

In addition, several sets of quartz resonators were produced in accordance with the present invention having second rotation angles ranging from ±7° to ±12°. About 500 units were produced at each degree of rotation. The results of these experiments are shown in FIG. 5. As can be seen, the tightest distribution is present at a rotation of about ±10°. However, an improvement in distribution over conventionally produced quartz resonators (at 0° omega rotation) can still be seen in a range of angles from about ±1° (interpolated) to about ±11.5° (measured).

The present invention also includes a method 100 of providing quartz crystal resonators with an improved distribution of frequency versus temperature performance.

The method 100 includes a first step 102 of providing a quartz crystal plate with a first angle rotation having an X-axis and Z'-axis lying within a plane corresponding to an AT-cut and a second angle rotation within the plane of the AT-cut having an angle within a range of about +1 to about ±11.5° from the Z'-axis of the AT-cut. A second step 104 of the method includes disposing substantially opposing electrodes on major faces of the quartz crystal plate. An optional third step of the invention includes mounting the quartz resonator within a (provided) hermetic package such that electrical connections are made from the disposed electrodes to external electrical connections.

In a preferred embodiment, the providing step 102 includes the quartz crystal plate being rectangular with a major dimension along the second angle of rotation. More preferably, the providing step includes the second angle of rotation being about ±10° from the Z'-axis of the AT-cut.

Alternatively, the providing step 102 includes the quartz crystal plate being rectangular with a minor dimension along the second angle of rotation.

The apparatus and method of the improvement of the present invention described above has the advantage of producing rectangular quartz resonators having a tightened distribution of measured frequency versus temperature performance. This improvement is surprising and unexpected as existing theory does not predict this behavior. It is theorized that a small mixing of axial angular components offsets the natural differences in stiffness that occur between the X and Z crystal axes of quartz to produce an improved configuration that is more forgiving to angle variations or external influences. The resulting improvement can be described as a first derivative of the Bechmann curve being of a smaller magnitude or absolute value the conventional rectangular AT-cut quartz resonators.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A quartz crystal resonator with improved temperature performance, comprising:

a quartz crystal plate with a first angle of rotation having an X-axis and Z'-axis lying within a plane corresponding to an AT-cut and a second angle of rotation within the plane of the AT-cut and lying within a one of ranges of about −1 to about −11.5° and 1° to about 11.5° from the Z'-axis of the AT-cut; and substantially opposing electrodes disposed on major faces of the quartz crystal plate.

2. The quartz crystal resonator of claim 1, wherein the quartz crystal plate is rectangular with a minor dimension along the second angle of rotation.

3. The quartz crystal resonator of claim 1, wherein the quartz crystal plate is rectangular with a major dimension along the second angle of rotation.

4. The quartz crystal resonator of claim 1, wherein the second angle of rotation is about ±10° from the Z'-axis of the AT-cut.

5. The quartz crystal resonator of claim 1, wherein the optimal second angle of rotation is a function of the actual angle of the Z'-axis of the AT-cut.

6. A quartz crystal resonator with improved temperature performance, comprising:

a rectangular quartz crystal plate with a first angle of rotation having an X-axis and Z'-axis lying within a plane corresponding to an AT-cut and a second angle of rotation within the plane of the AT-cut and lying within a one of range of about −1° to about −11.5° and 1° to about 11.5° from the Z'-axis of the AT-cut, a major dimension of the rectangular quartz crystal plate lying along the second angle of rotation; and substantially opposing electrodes disposed on major faces of the quartz crystal plate.

7. The quartz crystal resonator of claim 6, wherein the second angle of rotation is about ±10° from the Z'-axis of the AT-cut.

8. A method of providing quartz crystal resonators with improved temperature performance, comprising the steps of:

providing a quartz crystal plate with a first angle rotation having an X-axis and Z'-axis lying within a plane corresponding to an AT-cut and a second angle rotation within the plane of the AT-cut having an angle within a one of ranges of about −1° to about −11.5° and 1° to about 11.5° from the Z'-axis of the AT-cut; and disposing substantially opposing electrodes on major faces of the quartz crystal plate.

9. The method of claim 8, wherein the providing step includes the quartz crystal plate being rectangular with a major dimension along the second angle of rotation.

10. The method of claim 8, wherein the providing step includes the quartz crystal plate being rectangular with a minor dimension along the second angle of rotation.

11. The method of claim 8, wherein the providing step includes the second angle of rotation being about ±10° from the Z'-axis of the AT-cut.

* * * * *